(12) United States Patent
Ohno (10) Patent No.: US 7,936,001 B2
(45) Date of Patent: May 3, 2011

(54) SEMICONDUCTOR DEVICE

(75) Inventor: Akio Ohno, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 436 days.

(21) Appl. No.: 11/850,689

(22) Filed: Sep. 6, 2007

(65) Prior Publication Data

US 2008/0061344 A1     Mar. 13, 2008

(30) Foreign Application Priority Data

Sep. 7, 2006   (JP) ................. 2006-242761

(51) Int. Cl.
    *H01L 27/108*     (2006.01)
    *H01L 29/94*     (2006.01)
(52) U.S. Cl. ................. 257/306; 257/E27.084
(58) Field of Classification Search .......... 257/306, 257/E27.084
See application file for complete search history.

(56) References Cited

U.S. PATENT DOCUMENTS

| | | | |
|---|---|---|---|
| 2003/0006444 A1* | 1/2003 | Amo et al. | 257/296 |
| 2003/0215997 A1* | 11/2003 | Hachisuka et al. | 438/241 |
| 2004/0183111 A1* | 9/2004 | Shinkawata | 257/296 |
| 2005/0001253 A1* | 1/2005 | Sugimura | 257/296 |
| 2006/0138561 A1* | 6/2006 | Seo et al. | 257/382 |
| 2007/0123032 A1* | 5/2007 | Yamazaki | 438/624 |
| 2008/0012146 A1* | 1/2008 | Nishimura | 257/774 |

FOREIGN PATENT DOCUMENTS

| | | |
|---|---|---|
| JP | 2002-203812 | 7/2002 |
| JP | 2002-353334 | 12/2002 |
| JP | 2003-23111 | 1/2003 |

* cited by examiner

*Primary Examiner* — Kiesha R Bryant
*Assistant Examiner* — Igwe U Anya
(74) *Attorney, Agent, or Firm* — Young & Thompson

(57) ABSTRACT

In a pair of adjacent stack contact and stack contact in the semiconductor device, the plugs and the plugs are disposed so that a center-to-center distance of the plugs extending through a second interlayer insulating film, which is thicker than the first interlayer insulating film, is larger than a center-to-center distance of the plugs extending through the first interlayer insulating film.

11 Claims, 8 Drawing Sheets

SEMICONDUCTOR DEVICE

This application is based on Japanese patent application No. 2006-242,761, the content of which is incorporated hereinto by reference.

BACKGROUND

1. Technical Field

The present invention relates to a semiconductor device, and in particular relates to a semiconductor device having a stack contact, in which a plurality of plugs are stacked.

2. Related Art

Typical conventional technologies related to semiconductor devices having a stack-type dynamic random access memory (DRAM) capacitor includes technologies disclosed in Japanese Patent Laid-Open No. 2002-203,812, Japanese Patent Laid-Open No. 2002-353,334 and Japanese Patent Laid-Open No. 2003-23,111. Among these, Japanese Patent Laid-Open No. 2002-203,812 discloses a technology of forming contact holes of a stacked structure in a semiconductor device, which compatibly contains DRAM cell and a logic embedded therein.

On the other hand, Japanese Patent Laid-Open No. 2002-353,334 discloses a semiconductor device that compatibly contains a DRAM region and a logic region embedded therein. Japanese Patent Laid-Open No. 2002-353,334 also discloses a condition, in which some misalignment is caused when a connecting hole is formed to reach a diffusion layer of the DRAM region.

Besides, Japanese Patent Laid-Open No. 2003-23,111 discloses a semiconductor device that simultaneously has a DRAM memory cell unit and a logic static random access memory (SRAM) embedded therein.

In such stack type semiconductor devices including a DRAM capacitor, a connecting plug extending through a capacitor-forming layer and an interlayer insulating film disposed above the capacitor-forming layer may be possibly formed. For example, when a bit line connecting plug is formed above the DRAM cell, a stack contact, which is configured to have stacked plurality of connecting plugs serving as the bit line connecting plugs, is employed. In addition, a stack contact extending from the semiconductor substrate to the above of the DRAM capacitor may be possibly formed in a peripheral circuit of the DRAM.

In addition, in the device that compatibly contains a DRAM region and a region of the other device, a stack contact having a geometry that is substantially the same as a geometry of a bit line connecting plug may often be provided in the region of the other device. For example, such configuration is adopted for the logic region described in Japanese Patent Laid-Open No. 2002-353,334 as described above.

However, the present inventor has investigated and found problems. A progressing miniaturization of devices requires a reduced space between the stack contacts, and in such environment, a stable formation may be often difficult, when a plurality of connecting plugs that extends through a capacitor-forming layer and an interlayer insulating film disposed thereon are formed to be arranged in mutually adjacent relationship.

The following aspects have been found for the reasons of such problem. In the conventional devices, the stack contacts are formed by stacking the underlying plug constituting the stack contact and the upper layer plug constituting the stack contact, both of which have the same layout.

However, in general, the thickness of the interlayer insulating film is larger than the thickness of the underlying layer in a DRAM capacitor-forming layer. Thus, when the DRAM capacitor-forming layer is included, and a connecting plug extending beyond the DRAM capacitor-forming layer is formed, the connecting hole is required to be deeper. In addition, the connecting hole tends to have a larger diameter in the upper surface of the interlayer insulating film, in order to improving a filling-ability of an electrically conducting material. When a miniaturization is further progressed, it is concerned that such problem may leads to cause a short circuit between adjacent connecting plugs.

While the devices having the DRAM capacitor have been illustrated in the above description, similar problems may also be occurred when a relatively bulky element such as a capacitor and the like is formed in an interlayer insulating film. In other words, since a thickness of the interlayer insulating film is increased in a region for forming a relatively bulky element, it may often be difficult to form a pair of adjacent connecting plugs extending beyond such interlayer insulating film to the upper layer thereof.

To solve the problem, further investigations of the present inventor have eagerly been performed for achieving a stable formation of a plurality of stacked contacts in adjacent locations, so that the present invention is achieved.

SUMMARY

According to one aspect of the present invention, there is provided a semiconductor device, comprising: a first interlayer insulating film provided above a semiconductor substrate; a second interlayer insulating film, provided above the first interlayer insulating film, and having a larger thickness than the thickness of the first interlayer insulating film; and a pair of adjacent electroconductive connecting plugs, provided to cover from the first interlayer insulating film to the second interlayer insulating film, and extending through the first interlayer insulating film and the second interlayer insulating film, wherein each of the pair of adjacent connecting plugs includes an electroconductive first plug extending through the first interlayer insulating film, and an electroconductive second plug extending through the second interlayer insulating film and being coupled to the first plug, and wherein the first plug and the second plug are arranged in the pair of adjacent connecting plugs so that a center-to-center distance of the second plugs is larger than a center-to-center distance of the first plugs.

In the present invention, the first plug and the second plug are arranged, so that the center-to-center distance of the second plugs extending through the second interlayer insulating film that is thicker than the first interlayer insulating film is larger than the center-to-center distance of the first plugs extending through the first interlayer insulating film, in the pair of adjacent connecting plugs.

This configuration can provide an increased center-to-center distance of the second plugs, such that a pair of second plugs can stably be formed in the thick second interlayer insulating film in mutually separated arrangement, even if a pair of adjacent connecting plugs are closely provided. In addition, the configuration can also provide an effective inhibition of a failure in the manufacture such as a short-circuit between the connecting plugs and the like. Thus, according to the present invention, an improved production yield of the semiconductor devices can be achieved.

In addition to above, the second interlayer insulating film may be a single insulating film, or may be a multiple-layered film of a plurality of insulating films. For example, the second interlayer insulating film may be configured to be composed of a third interlayer insulating film provided above the first interlayer insulating film and fourth interlayer insulating film provided so as to be in contact with an upper portion of the third interlayer insulating film. In such case, the second plug extends through third and fourth interlayer insulating films.

According to another aspect of the present invention, there is provided a semiconductor device, comprising: a first element region, provided in a semiconductor substrate, and containing a capacitor; a second element region provided in the semiconductor substrate; a first interlayer insulating film provided above the semiconductor substrate covering from the second element region to the first element region; a third interlayer insulating film, provided above the first interlayer insulating film covering from the second element region to the first element region, and having the capacitor embedded in the first element region; and a fourth interlayer insulating film, provided so as to be in contact with an upper portion of the third interlayer insulating film covering from the first element region to the second element region, and provided above the capacitor, wherein the first element region is provided with a first diffusion layer provided in the semiconductor substrate and a first connecting plug extending through the third interlayer insulating film and the fourth interlayer insulating film and coupled to the first diffusion layer, wherein the second element region is provided with a pair of adjacent second connecting plugs provided to cover from the first interlayer insulating film to the fourth interlayer insulating film and extending through the first interlayer insulating film, the third interlayer insulating film and the fourth interlayer insulating film, wherein each of the pair of adjacent second connecting plugs includes an electroconductive first plug extending through the first interlayer insulating film and an electroconductive second plug extending through the third interlayer insulating film and the fourth interlayer insulating film and providing a connecting to the first plug, wherein the second plug has a geometry that is substantially same as a geometry of the first connecting plug, and wherein the first plug and the second plug are arranged so that a center-to-center distance of the second plugs is larger than a center-to-center distance of the first plugs in the pair of adjacent second connecting plugs.

In such configuration, the first connecting plug, which extends through the third interlayer insulating film having the capacitor embedded in the first element region and the fourth interlayer insulating film disposed on the capacitor, and is coupled to the first diffusion layer, is provided in the first element region. On the other hand, the second element region is provided with a pair of adjacent second connecting plugs. The second plug that constitutes the pair of adjacent second connecting plugs have the geometry, which is substantially same as the geometry of the first connecting plug.

When a pair of adjacent second connecting plugs are provided to be mutually closer arrangement in the conventional technology, a stable formation of the second plug may be often difficult, as described above.

On the contrary, in the present invention, the first plug and the second plug are arranged so that a center-to-center distance of the second plugs that extends through the third interlayer insulating film and the fourth interlayer insulating film is larger than a center-to-center distance of the first plugs that extends through the first interlayer insulating film, in the pair of adjacent second connecting plugs. This allows providing an increased center-to-center distance of the second plugs that extends through a capacitor-forming layer and an interlayer insulating film disposed above the capacitor-forming layer. Therefore, a pair of second plugs can stably be formed in mutually separated arrangement, even if the pair of adjacent connecting plugs are closely disposed. In addition, the configuration can also provide an effective inhibition of a failure in the manufacture such as a short-circuit between the second connecting plugs and the like. Thus, according to the present invention, an improved production yield of the semiconductor devices can be achieved.

Since the first plug and the second plug are arranged so that the center-to-center distance of the second plugs is larger than the center-to-center distance of the underlying first plugs according to the present invention as described above, a stable formation of a plurality of stacked contacts in closer locations can be achieved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable exemplary implementations according to the present invention will be described in reference to the annexed figures. In all figures, identical numeral is assigned to an element commonly appeared in the description of the present invention in reference to the figures, and the detailed description thereof will not be repeated.

First Embodiment

Figure 1:
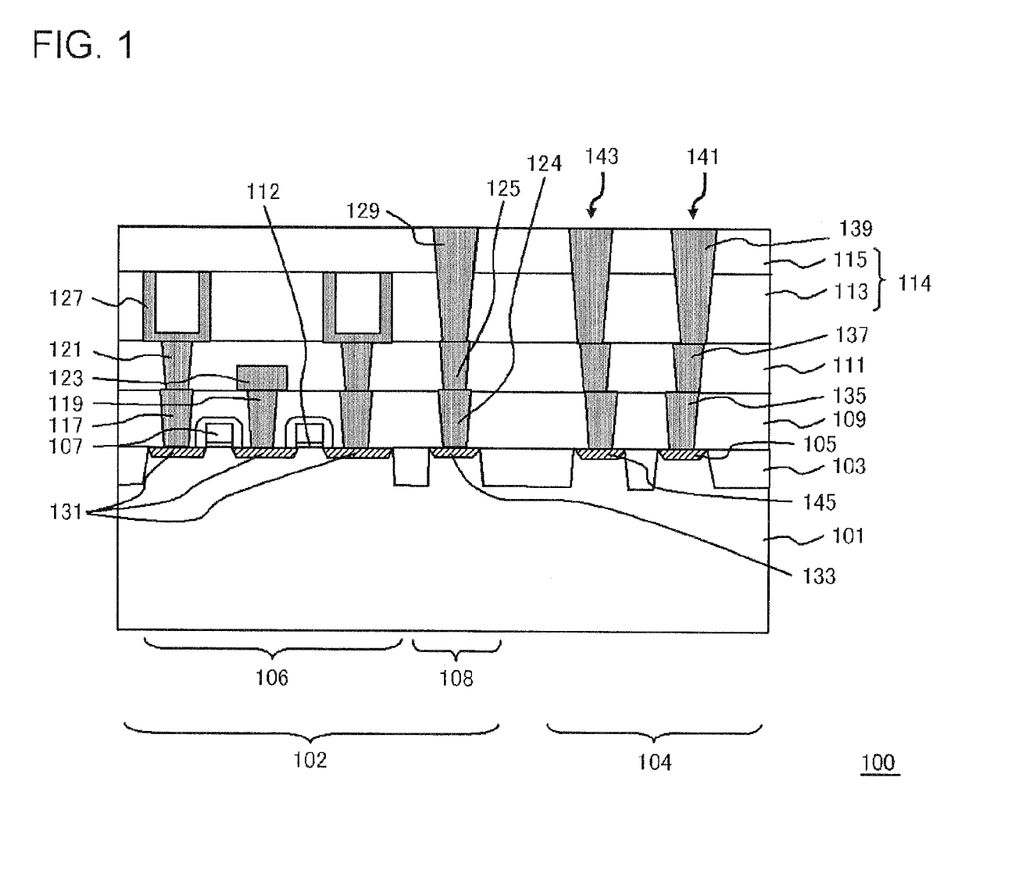
FIG. 1 is a cross-sectional view, illustrating a configuration of a semiconductor device in an embodiment.

FIG. 1 is a cross-sectional view, illustrating a configuration of a semiconductor device of the present embodiment.

A semiconductor device 100 shown in FIG. 1 includes a first interlayer insulating film 109 provided above a semiconductor substrate (silicon substrate 101), and a second interlayer insulating film 114 provided above the first interlayer insulating film 109 and having larger thickness than the first interlayer insulating film 109.

In the present embodiment, the second interlayer insulating film 114 is composed of a third interlayer insulating film 113 provided above the first interlayer insulating film 109 and a fourth interlayer insulating film 115 provided so as to be in contact with an upper side of the third interlayer insulating film 113, and the third interlayer insulating film 113 is thicker than the first interlayer insulating film 109. However, the second interlayer insulating film 114 is not limited to a multiple-layered film, and may also be composed of a single insulating film.

In addition, the semiconductor device 100 includes a pair of adjacent electroconductive connecting plugs (stack contact 141 and stack contact 143), provided to cover from the first interlayer insulating film 109 to the second interlayer insulating film 114, and extending through the first interlayer insulating film 109 and the second interlayer insulating film 114.

A pair of adjacent stack contact 141 and stack contact 143 include an electroconductive first plug extending through the first interlayer insulating film 109 (plug 135) and an electroconductive second plug (plug 139) extending through the second interlayer insulating film 114 and providing an electrical connecting with a plug 135.

In these pair of adjacent stack contacts, the plug 135 and the plug 139 are arranged so that a center-to-center distance of the plugs 139 is larger than a center-to-center distance of the plugs 135.

The configuration of the semiconductor device 100 will be further specifically described below. In addition to above, in the descriptions of the present embodiment and the following embodiments, devices compatibly containing DRAM region and SRAM region embedded therein will be exemplified.

The semiconductor device 100 includes a first element region (DRAM unit 102) provided in the silicon substrate 101 and having a capacitor (DRAM capacitor 127) and a second element region (SRAM unit 104) provided in the silicon substrate 101.

In addition, the semiconductor device 100 includes the first interlayer insulating film 109 provided above the silicon substrate 101 covering from the DRAM unit 102 to the SRAM unit 104, the third interlayer insulating film 113, provided above the first interlayer insulating film 109 covering from the DRAM unit 102 to the SRAM unit 104, and having the DRAM capacitor 127 embedded in the DRAM unit 102, and the fourth interlayer insulating film 115, provided so as to be in contact with an upper surface of the third interlayer insulating film 113 covering from the DRAM unit 102 to the SRAM unit 104, and provided above the DRAM capacitor 127.

In FIG. 1, the first interlayer insulating film 109 is provided so as to be in contacted with a device-forming surface of the silicon substrate 101, and the interlayer insulating film 111, the third interlayer insulating film 113 and the fourth interlayer insulating film 115 are deposited on the first interlayer insulating film 109 in this sequence from the bottom. In addition to above, each of the first interlayer insulating film 109, the interlayer insulating film 111, the third interlayer insulating film 113 and the fourth interlayer insulating film 115 may be a single layer or a multiple-layered film.

The DRAM unit 102 contains a DRAM cell unit 106 and a DRAM peripheral circuit unit 108, which is isolated by an element isolation region 103 such as a shallow trench isolation (STI).

In the DRAM cell unit 106, the silicon substrate 101 is provided with a diffusion layer 131. In addition, a gate electrode 107 constituting a transistor of the DRAM is provided on the silicon substrate 101 through a gate insulating film 112. In addition, the lateral side of the gate electrode 107 is provided with a bit contact plug 119, which extends through the first interlayer insulating film 109 and is in contact with an upper surface of the diffusion layer 131. The bit contact plug 119, in its upper surface, contacts with a bit line 123 embedded in the interlayer insulating film 111.

In addition, the DRAM cell unit 106 is provided with a capacitor connecting plug 117, which is in contact with the upper surface of the diffusion layer 131 and extends through the first interlayer insulating film 109, and a capacitor connecting plug 121, which is in contact with the upper surface of the capacitor connecting plug 117 and extends through the interlayer insulating film 111. The capacitor connecting plug 121, in its upper surface, is electrically connected to a lower electrode (not shown) of the DRAM capacitor 127. As described above, the DRAM capacitor 127 is connected to the diffusion layer 131 through a plurality of plugs. Here, the DRAM capacitor 127 is a cylinder-shaped capacitor provided from a bottom surface to a side surface of a through hole formed in the third interlayer insulating film 113. The DRAM capacitor 127 is formed from a lower surface to an upper surface of the third interlayer insulating film 113. DRAM capacitor 127 is composed of a lower electrode (not shown), an upper electrode disposed thereon (not shown), and a capacitive film provided therebetween (not shown).

The DRAM peripheral circuit unit 108 of the DRAM unit 102 includes, for example, a sense amplifier circuit, an address selection circuits or the like. The DRAM peripheral circuit unit 108 is provided with a first diffusion layer provided in the silicon substrate 101 (diffusion layer 133) and a first connecting plug (plug 129), which extends through the third interlayer insulating film 113 and the fourth interlayer insulating film 115 and is coupled to the diffusion layer 133. The upper surface of plug 129 located in higher position than the upper end of the DRAM capacitor 127.

The DRAM peripheral circuit unit 108 is also provided with a plug 124, which is in contact with the upper surface of the diffusion layer 133 and extends through the first interlayer insulating film 109, and a plug 125, which is in contact with the upper surface of the plug 124 and extends through the interlayer insulating film 111. The plug 129 is provided so as to be in contact with the upper surface of the plug 125. The plug 124, the plug 125 and the plug 129 are stack contacts, which are electrically coupled to the diffusion layer 133. The central axes of the plug 124, the plug 125 and the plug 129 are substantially common, or in other words, these plugs are substantially coaxial. More specifically, these plugs are provided without intentionally deviating the central axes.

In addition, a pair of adjacent second connecting plugs (stack contact 141, stack contact 143), which is provided from the first interlayer insulating film 109 to the fourth interlayer insulating film 115 and extends through the first interlayer insulating film 109, the third interlayer insulating film 113 and the fourth interlayer insulating film 115, are provided in the SRAM unit 104.

Each of the pair of adjacent stack contacts includes an electroconductive plug 135 extending through the first interlayer insulating film 109 and an electroconductive plug 139 extending through the third interlayer insulating film 113 and the fourth interlayer insulating film 115 and being coupled to the plug 135. In addition, the stack contact 141 and the stack contact 143, are electrically coupled to the diffusion layer 105 and the diffusion layer 145, respectively.

It is sufficient that the stack contact 141 and the stack contact 143 are a multiple-layered member of at least two plugs. In FIG. 1, the stack contact 141 and the stack contact 143 are configured of three plugs, namely, the plug 135, the plug 137 and the plug 139, which are stacked in this sequence from the bottom.

The pair plugs 135 have the substantially same geometry, and both are provided so as to be in contact with a pair of diffusion layers (diffusion layer 105, diffusion layer 145) formed in vicinity of the surface of the silicon substrate 101 in the SRAM unit 104. The plugs 135 have a geometry, which is, for example, substantially the same as the geometry of the plug 124.

The pair plugs 137 have the substantially same geometry, and both are plugs, which are provided so as to be in contact with the upper surface of the plug 135 and the lower surface of the plug 139 and extend through the interlayer insulating film 111. The plugs 137 have a geometry, which is, for example, substantially the same as the geometry of the plug 125.

In addition, the pair plugs 139 constitute adjacent the pair stack contacts have substantially the same geometry. The plugs 139 are provided to cover from the lower surface to the upper surface of the second interlayer insulating film 114. The diameter of the bottom surface of the plug 139 is, for example, substantially the same as the diameter of the bottom surface of the plug 135. On the other hand, the diameter of the upper surface of the plug 139 is, for example, larger than the diameter of the upper surface of the plug 135. This is because the connecting hole having the plugs embedded therein is formed to have a forwardly tapered geometry (more specifically, a geometry, in which a top opening is larger than the bottom opening), and at the same time, the film thickness of the third interlayer insulating film 113 where the bulky DRAM capacitor 127 is formed therein is thicker than the thickness of the first interlayer insulating film 109.

The plug 139 has a geometry, which is substantially the same as the plug 129 provided in the DRAM peripheral circuit unit 108. Here, the "geometry is substantially same" indicates that geometry is not intentionally changed during the manufacture, and for example, it is sufficient to provide such condition if the respective plugs are manufactured by employing the substantially same mask pattern. In addition, for example, patterned masks for forming the plug 135, the plug 137 and the plug 139 may have the same geometry and the same dimension.

In the stack contact 141 and the stack contact 143, which serve as a pair of adjacent stack contacts, the plugs 135 and the plugs 139 are arranged, so that a distance between the central axes of the plugs 139 are larger than a distance between the central axes of the plugs 135.

In addition to above, in FIG. 1, concerning the center-to-center distances between plugs for the plug 139, the plug 137 and the plug 135 in the stack contact 141 and the stack contact 143, the center-to-center distance is largest in the plug 139 and is smallest in the plug 135. More specifically, larger plug-plug distance is presented for higher level of the layers.

Next, a method for manufacturing the semiconductor device 100 will be described. First of all, the element isolation region 103, the diffusion layer 131, the diffusion layer 133, the diffusion layer 145, the diffusion layer 105, the gate insulating film 112 and the gate electrode 107 are formed on or above the silicon substrate 101.

Next, the first interlayer insulating film 109 is formed on the silicon substrate 101 having the gate electrode 107 formed thereon. A through hole is formed in predetermined location of first interlayer insulating film 109, and predetermined electrically conducting films such as a barrier metal film and a tungsten film and the like are consecutively formed so as to fill the through hole. Then, the electrically conducting films formed outside of the through hole are removed. This procedure provides a formation of the capacitor connecting plug 117, the bit contact plug 119, the plug 124 and the plug 135.

Subsequently, the bit line 123 contacting with the bit contact plug 119 is formed. Then, the interlayer insulating film 111 covering the bit line 123 is formed so as to be in contact with the first interlayer insulating film 109. A through hole is formed in a predetermined location in the interlayer insulating film 111, more specifically, above the capacitor connecting plug 117, the plug 124 and a pair of plugs 135. At this time, the center-to-center distance of the through holes formed above a pair of adjacent plugs 135 are designed to be larger than the center-to-center distance of the plugs 135. Thereafter, the capacitor connecting plug 121, the plug 125 and the plug 137 are obtained according to the procedure described above.

Then, the third interlayer insulating film 113 is formed so as to be in contact with the interlayer insulating film 111. Through holes are formed in locations corresponding to the capacitor connecting plugs 121 of the third interlayer insulating film 113, and then, a DRAM capacitor 127 is formed in the through hole by, for example, a known method.

Subsequently, a fourth interlayer insulating film 115 covering the portions above the DRAM capacitor 127 is formed so as to be in contact with the third interlayer insulating film 113. Through holes extending through the fourth interlayer insulating film 115 and the third interlayer insulating film 113 are formed in the locations corresponding to the plug 125 and a pair of plugs 137. At this time, a center-to-center distance of the through holes formed above the pair of adjacent plugs 137 is designed to be larger than a center-to-center distance of a pair of adjacent plugs 135. Thereafter, the plug 129 and the plug 139 are obtained according to the procedure described above. The semiconductor device 100 is eventually obtained through the above-mentioned procedure.

Here, in the above-mentioned method for manufacturing, when the arrangement is designed for obtaining the center-to-center distance of the adjacent stack contacts 141 and stack contact 143 to be larger than a predetermined value, the design may be made so that the central axis of the plug 135 or the plug 137 coincides with the central axis of the plug 139, and when the arrangement is designed for obtaining the center-to-center distance of the adjacent stack contact 141 and stack contact 143 to be equal to or lower than a predetermined value, the design may be made so that the central axis of the plug 135 or the plug 137 is offset with the central axis of the plug 139. In addition, after the above-mentioned procedure, a predetermined interconnect structure may be, for example, further formed on the fourth interlayer insulating film 115.

Next, advantageous effects obtainable by employing the configuration of the present invention will be described. In the present embodiment, in the stack contact 141 and the stack contact 143 serving as a pair of adjacent stack contacts, the center-to-center distance of plugs 139 are larger than the center-to-center distance of plugs 135. Thus, even if the thickness of the interlayer insulating film where the plug 139 is formed is larger than the thickness of the first interlayer insulating film 109 where the plug 135 is formed, the plugs 139 can be mutually separated with a certainty by providing larger center-to-center distance of the plugs 139. Thus, when the stack contact 141 and the stack contact 143 are closely provided, a formation failure such as a short-circuit of plugs 139 can be prevented.

Such advantageous effect can be considerably exhibited when the plug 139 is formed to extend from a layer for forming a relatively bulky element including capacitor such as the DRAM capacitor 127 and the like to the upperlying layer. Further description will be made below for such advantageous effect.

Figure 2:
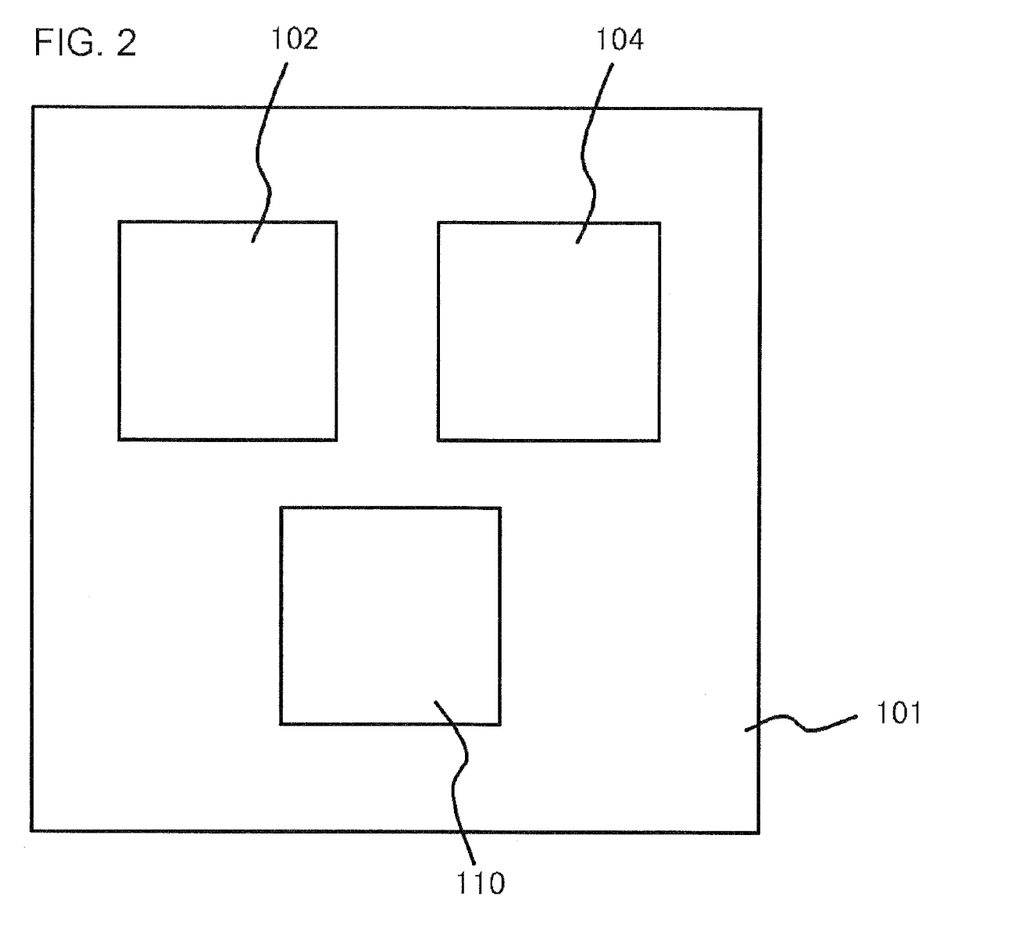
FIG. 2 is a plan view, illustrating a configuration of a semiconductor device in the embodiment.

For example, in a device compatibly containing an element region comprising a stack type DRAM capacitor and other element region such as the semiconductor device 100, a so-called global step is increased in the chip, as the stacking process of the interlayer insulating films is progressed in the operation of forming the DRAM capacitor 127. The global step is a step created among the regions of the DRAM unit 102, the SRAM unit 104, and the logic unit 110 (FIG. 2). In the embedded semiconductor device, the increased global step may cause a variation in a flatness of the upper surface of the fourth interlayer insulating film 115. Thus, when the plugs constituting the stack contact, in particular the plug of the upper layer, is formed, a mis-focusing is often created in a lithographic process.

In addition, a larger diameter of the connecting hole tends to be selected in the upper surface of the interlayer insulating film for improving the ability for filling the connecting hole with the electroconductive material, and thicker interlayer insulating film having the connecting hole formed therein leads to larger aperture in the top of the connecting hole. As a result, a plug-to-plug distance in the upper portion of a pair of plugs 139 formed in the thick interlayer insulating film is smaller than a plug-to-plug distance in the upper portion of a pair of plugs 135 formed in the thinner insulating film, and in such reason, a pattern collapse is easily created in a pair of plugs 139 in the upper layer, as compared with a pair of plugs 135 in the lower layer.

Thus, when the stack contact 141 and the stack contact 143 are closely formed in ordinary devices involving no special innovation in the arrangement in the surface of the stack contact as in the conventional devices, there is a concern that a pattern collapse is generated.

On the contrary, in the present embodiment, the center-to-center distance of the plugs 139 constituting the upper layer of the stack contact is increased, as compared with the center-to-center distance of the underlying plugs 135. This allows effectively inhibiting a pattern collapse of a pair of plug 139 when a mis-focusing is caused during the patterning process.

While the configuration that the DRAM unit 102 and the SRAM unit 104 are provided in the semiconductor device 100 is exemplified in the present embodiment, a third element region provided in the silicon substrate 101 may be further included in the descriptions of the present embodiment and the following embodiments.

FIG. 2 is a plan view, illustrating configuration of such device. A semiconductor device shown in FIG. 2 includes a logic unit 110 composed of a central processing unit (CPU), or a logic circuit in the silicon substrate 101, serving as a third element region, in addition to the DRAM unit 102 and the SRAM unit 104. In such configuration, the advantageous effects described above are also obtained.

In addition, a plurality of regions are provided in one semiconductor device 100 to present a single-chip structure, so that a further rapid operation with smaller package of the device can be achieved.

In the following embodiment, the description will be made focusing on technical features that are different from first embodiment.

Second Embodiment

In the semiconductor device of first embodiment (FIG. 1), a misalignment may be created between the plug of the upper layer and the plug of the lower layer, which constitute a stack contact. In the present embodiment, an example of causing a misalignment will be described.

Figure 3:
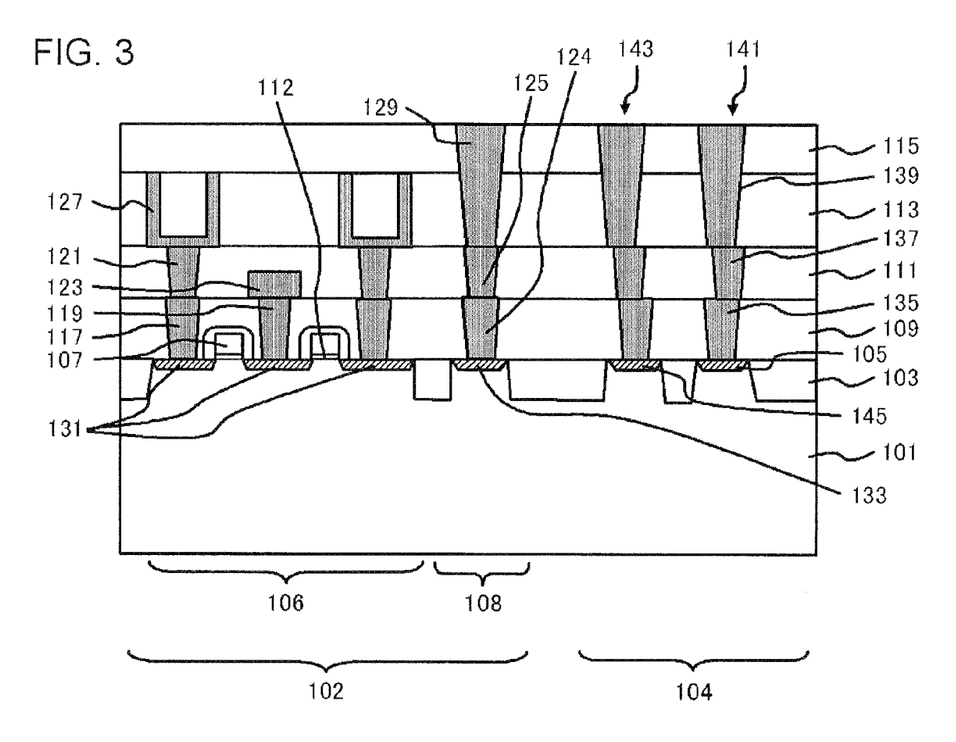
FIG. 3 is a cross-sectional view, illustrating a configuration of a semiconductor device in an embodiment.

FIG. 3 is a cross-sectional view, illustrating a configuration of a semiconductor device of the present embodiment. The fundamental configuration of the semiconductor device shown in FIG. 3 is similar to that shown in FIG. 1, except that a misalignment is caused between the plug 137 and the plug 139.

When a misalignment is caused in a conventional device, all of the adjacent plugs 139 are formed to be equally moved toward the same direction in the surface, and the center-to-center distance itself of the plugs 139 is not changed. Thus, there is a concern that a formation failure of the plugs 139 described above is caused regardless of conducting an alignment.

On the contrary, since the center-to-center distance of a pair of adjacent plugs 139 is larger than the center-to-center distance of plugs 135 in the present embodiment, Even if a misalignment is caused as shown in FIG. 3, the advantageous effect same as first embodiment can be obtained.

While the configuration of increasing the center-to-center distance of plugs in the order of the plug 135, the plug 137 and the plug 139 is exemplified in the above-mentioned embodiment, concerning at least the plugs 139 and plugs electrically coupled to the plugs 139 and provided in the underlying layer below the plugs 139, it is sufficient to be configured that the center-to-center distance of the plugs 139 is large that the center-to-center distance of the plugs in the underlying layer.

In the following embodiment, and example of the adjacent stack contact 141 and stack contact 143 constituting a common SRAM cell will be exemplified, and a two-dimensional arrangement of the stack contact 143 will be specifically described.

Third Embodiment

In the semiconductor devices as described in the above-mentioned embodiments, the stack contact 141 and the stack contact 143 may alternatively be an ordinary contact plug of the SRAM cell.

Figure 4:
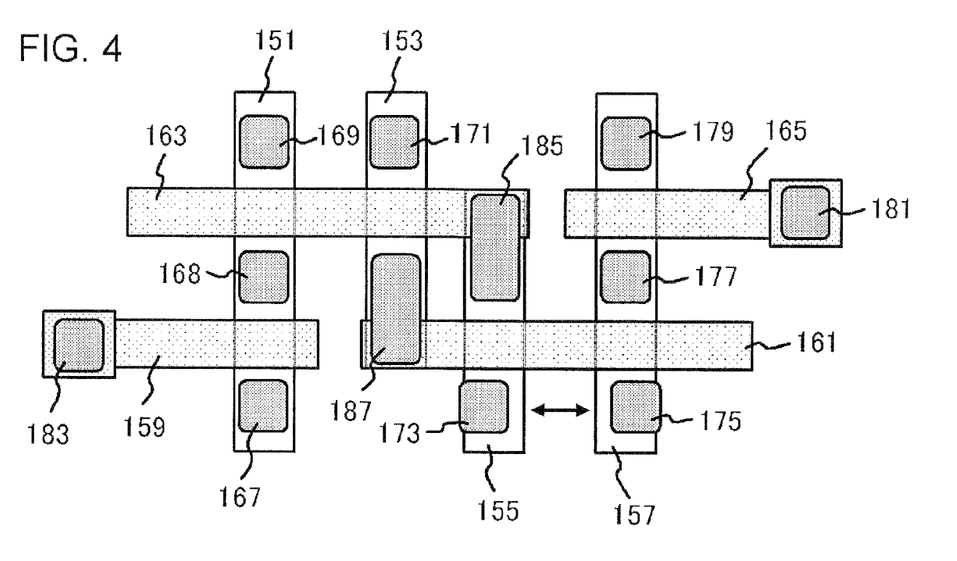
FIG. 4 is a plan view, illustrating a configuration of a unit cell of a SRAM of a semiconductor device in an embodiment.

FIG. 4 is a plan view, illustrating a configuration of a SRAM unit 104 of a semiconductor device according to the present embodiment. Here, a configuration of an unit cell in the SRAM will be illustrated. The unit cell includes a semiconductor region ($p^+$ diffusion layer region, however $n^-$ channel region beneath gate electrode) 155 and a semiconductor region ($p^+$ diffusion layer region, however $n^-$ channel region beneath gate electrode) 153, which are formed in a n-well (not shown), a semiconductor region ($n^+$ diffusion layer region, however $p^-$ channel region beneath gate electrode) 157 and a semiconductor region ($n^+$ diffusion layer region, however $p^-$ channel region beneath gate electrode) 151, which are formed in a p-well (not shown), and an element isolation region 103 (FIG. 4, not shown) for separating these regions.

An n-type MOS transistor including a gate electrode 165 and an n-type MOS transistor including a gate electrode 161 are formed in the semiconductor region 157. In the semiconductor region 157, a contact 177 is formed in a source-drain region between the gate electrode 165 and the gate electrode 161, and an interconnect (not shown) is formed above the contact 177 and above the shared contact 185 as will be discussed later for electrically connecting these contacts. In addition, a contact 179 is formed on a side of the gate electrode 165 where contact 177 is not formed. A contact 175 is formed on a side of the gate electrode 161 where contact 177 is not formed.

An n-type MOS transistor including a gate electrode 159 and an n-type MOS transistor including a gate electrode 163 are formed in the semiconductor region 151. In the semiconductor region 151, a contact 168 is formed in a source-drain region between the gate electrode 159 and the gate electrode 163, and an interconnect (not shown) is formed above the contact 168 and the shared contact 187 as will discussed later for electrically connecting these contacts. Further, a contact 169 is formed on a side of the gate electrode 163 where contact 168 is not formed. A contact 167 is formed on a side of the gate electrode 159 where contact 168 is not formed.

In the semiconductor region 155, a p-type MOS transistor including the gate electrode 161 and a shared contact 185 for electrically connecting a source-drain region of such transistor with the gate electrode 163 are formed. Further, a contact 173 is formed on a side of the gate electrode 161 where shared contact 185 is not formed.

In the semiconductor region 153, a p-type MOS transistor including the gate electrode 163 and a shared contact 187 for electrically connecting a source-drain region of such transistor with the gate electrode 161 are formed. Further, a contact 171 is formed on a side of the gate electrode 163 where shared contact 187 is not formed.

Here, the gate electrode 161, the gate electrode 163, the gate electrode 165 and the gate electrode 159 are provided above the silicon substrate 101, and side walls (not shown) are formed in the peripheries of these gate electrodes, respectively. Further, a contact 181 is provided so as to be in contact with a predetermined region above the gate electrode 165. Further, a contact 183 is provided so as to be in contact with a predetermined region above the gate electrode 159.

All of the contacts and the shared contacts described above are composed of stack contacts, and the locations of the contacts and the shared contacts shown in FIG. 4 represent the locations of the upper plugs constituting the stack contacts (corresponding to plugs 139 in FIG. 1).

In such unit cell, a pair of adjacent contacts 173 and contacts 175 correspond to a pair of stack contacts 141 and stack contacts 143 described in the above-mentioned embodiments. The contact 173 and the contact 175 serve as a pair of contacts provided in the same side over the gate electrode 161.

Further, the unit cell includes a second diffusion layer (semiconductor region 155, semiconductor region 157), provided in the lateral side of the gate electrode 161 of the silicon substrate 101, and the bottom surfaces of a pair of the adjacent contact 173 and contact 175 are provided so as to be in contact with the semiconductor region 155 and the semiconductor region 157, respectively.

In the present embodiment, an improve production yield can be achieved, even when the adjacent contact 173 and contact 175 are closely provided.

While the exemplary implementation of both of the pair of adjacent contact 173 and contact 175 being in contact with the diffusion layer is illustrated here, the above described configuration of the stack contact may alternatively be applied to contacts that are coupled to the gate electrode. In this case, both of the pair of adjacent contacts may be coupled to in gate electrode, or, one may be coupled to in the gate electrode and the other may be coupled to the diffusion layer.

Further, an alternative configuration may be employed in the present embodiment, in which the alternative SRAM unit 104 provided with three or more second connecting plugs (contacts) is configured to have the shortest center-to-center distance of the plugs (plugs 135) of the lowermost layer constituting the contact, which is a pair of adjacent contacts among the above-described three or more contacts.

Fourth Embodiment

While the exemplary implementation of applying the configuration of the stack contact 141 and the stack contact 143 of FIG. 1 to the contact 173 and the contact 175 is illustrated in third embodiment, the stack contact 141 and the stack contact 143 may also be applied to the pair of adjacent shared contacts that constitute a common unit cell.

Figure 5A:
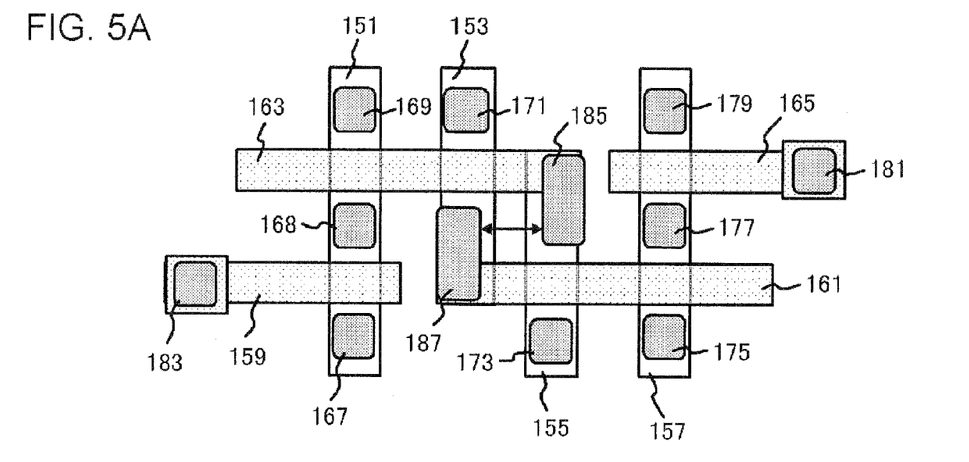
FIG. 5 is a plan view, illustrating a configuration of a unit cell of a SRAM of a semiconductor device in an embodiment.

FIG. 5A is a plan view, illustrating a configuration of an unit cell of a SRAM of the present embodiment. The fundamental configuration of the unit cell shown in FIG. 5A is similar to that shown in FIG. 4, except that the configurations of the stack contact 141 and the stack contact 143 are applied to the shared contact 185 and the shared contact 187.

Figure 5B:
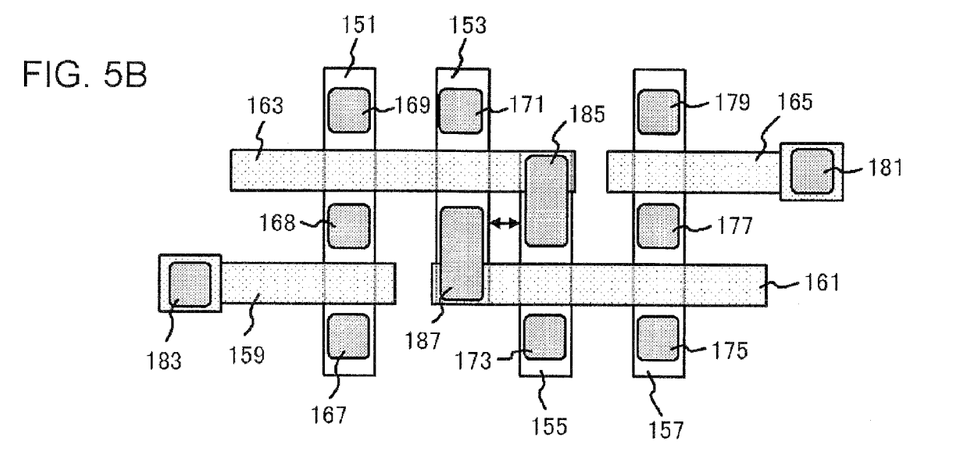

Here, in FIG. 5A and FIG. 5B, similarly as in FIG. 4, the locations of the contacts and the shared contacts represent the locations of the upper plugs constituting the stack contacts (correspond to plug 139 of FIG. 1).

In FIG. 5A, the shared contact 187 provides a connecting of the gate electrode 161 with a third diffusion layer (semiconductor region 153) provided in the silicon substrate 101 (not shown in FIG. 5A) in a side of the gate electrode 161. Further, the shared contact 185 provides a connecting of the gate electrode 163 with a third diffusion layer (semiconductor region 155) provided in the silicon substrate 101 (not shown in FIG. 5A) in a side of the gate electrode 163.

In addition to above, FIG. 5B represents a configuration in case that the configuration of the stack contacts described above is not applied to the shared contact 185 and the shared contact 187.

As shown in FIG. 5A and FIG. 5B, when a pair of shared contacts are stack contacts, the advantageous effects similar to third embodiment can also be obtained by providing a larger center-to-center distance of the plugs in the upper layer than that in the lower layer.

In addition to above, likely as the shared contact shown in FIG. 5A and FIG. 5B, a two-dimensional geometry of the contact constituting the stack contact may be rectangular geometry, a modified rectangular geometry having rounded corners, an oval geometry, or the like. When a section overlapping in longitudinal direction of the contact is included as described above, a center-to-center distance of the contacts is equivalent to a distance between the central lines, which are parallel to the longitudinal direction of the contacts.

Further, it may also configured that the contact in the lowermost layer in the pair of stack contacts is a shared contact and the contacts in the second or upper levels or only the contact in the third level are (is) ordinary contact(s). At this time, the center-to-center distance of the contacts in the second or upper level constituting a pair of stack contacts may be designed to be larger than the center-to-center distance of the shared contacts in the lowermost layer.

Figure 6:
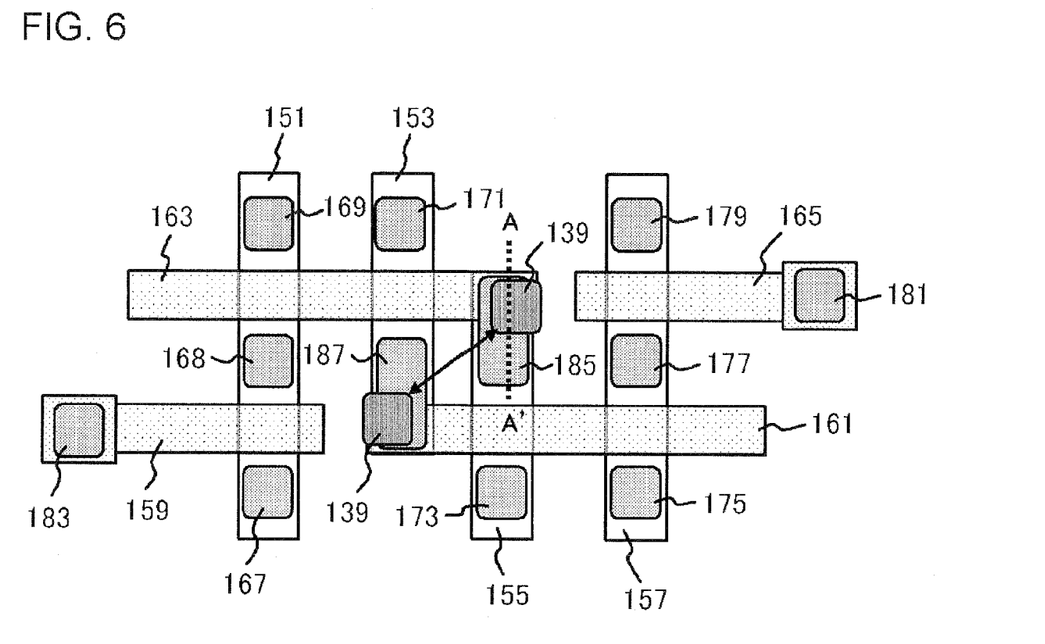
FIG. 6 is a plan view, illustrating a configuration of a unit cell of a SRAM of a semiconductor device in an embodiment.
Figure 7:
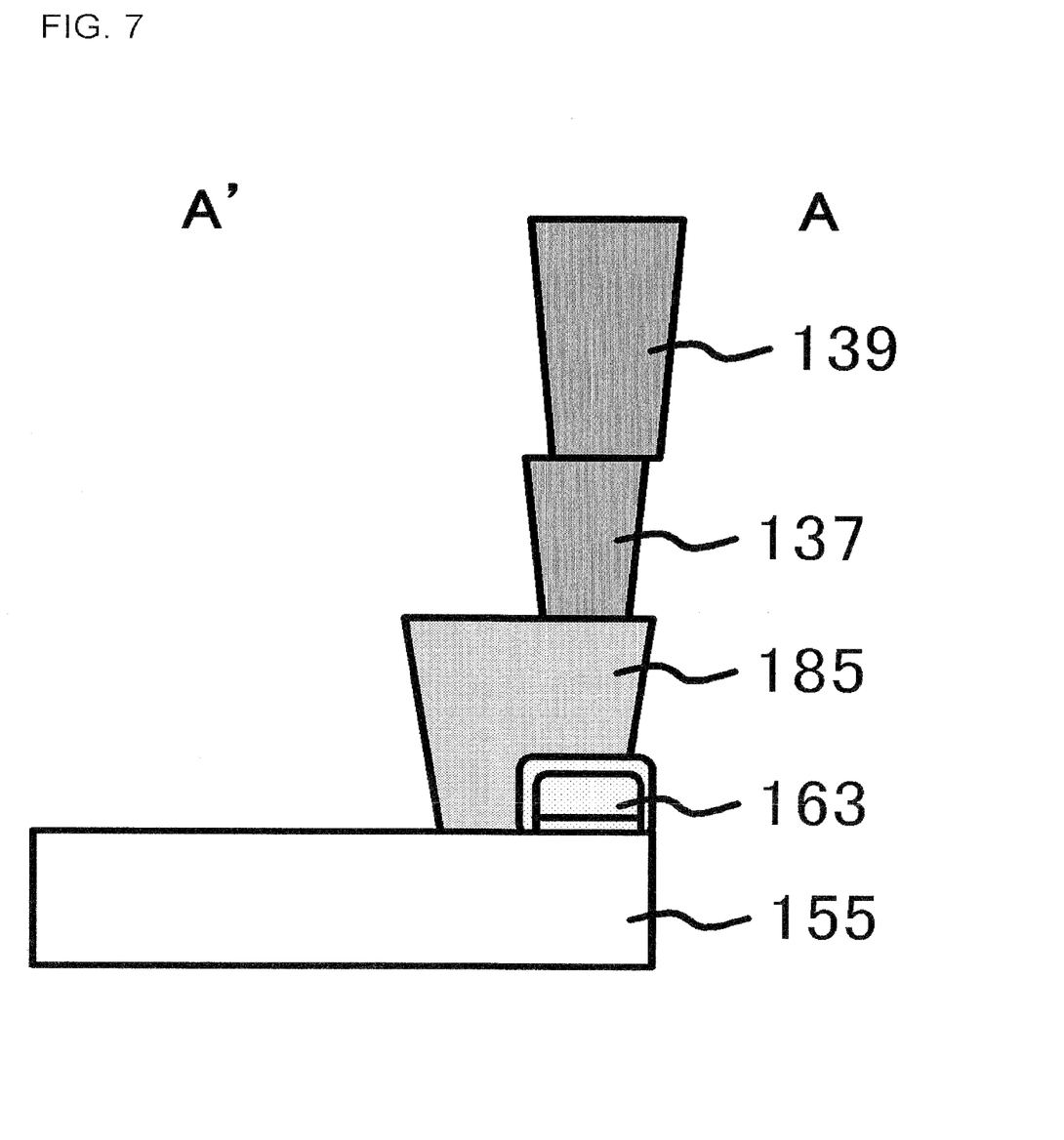
FIG. 7 is a cross-sectional view of FIG. 6 along line A-A'.

FIG. 6 is a plan view, illustrating such configuration of the unit cell of the SRAM. FIG. 7 is a cross-sectional view of FIG. 6 along line A-A'.

The fundamental configuration of a semiconductor device shown in FIG. 6 is similar to that shown in FIG. 4, except that the configuration of the stack contact 141 and the stack contact 143 is applied to a pair of stack contacts including the shared contact 185 and the shared contact 187 in FIG. 6. Further, in FIG. 6 and FIG. 7, the contact in the lowermost layer is a shared contact and the contacts in the second or upper levels are ordinary contacts. The shared contact 185 and the shared contact 187 correspond to a pair of plugs 135 in FIG. 1.

In such a configuration, the center-to-center distance of plugs 139 may be selected to be larger than the center-to-center distance between the shared contact 185 and the shared contact 187 as illustrated here, so that advantageous effects similar to that obtained in the above-mentioned embodiments can also be obtained.

In addition to above, while the exemplary implementation is illustrated that the centers of the plugs 139 are offset obliquely against the A-A' direction to provide an increased center-to-center distance of the plugs 139 in FIG. 6, the manner of the offset arrangement of the plugs 139 is not particularly limited, and for example, the plugs 139 may be moved toward the lateral direction (direction to be normal to line A-A').

Further, while the exemplary implementation is illustrated in relation to the center-to-center distance between the shared contact 185 and the shared contact 187 in FIG. 6 that the center-to-center distance of a pair of plugs 137 and the center-to-center distance of a pair of plugs 139 are stepwise increased, it may also be at least sufficient that the center-to-center distance of the plugs 139 is larger than the center-to-center distance of the shared contact 185 and the shared contact 187.

While the exemplary implementation of the configuration of the SRAM including the shared contact is illustrated in the present embodiment and third embodiment, the configuration of the SRAM may alternatively include no shared contact.

Figure 8:
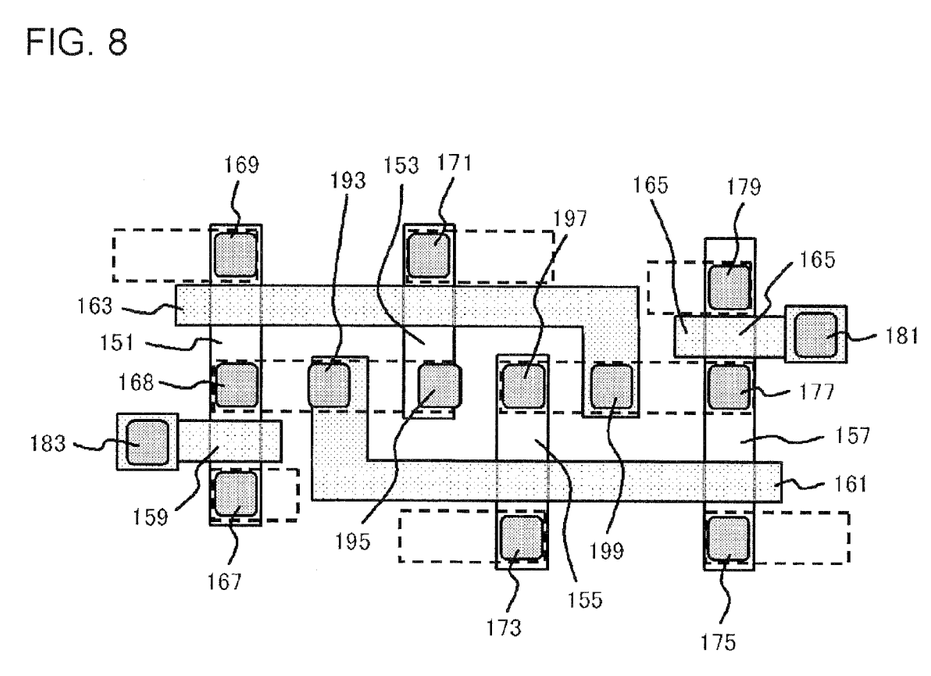
FIG. 8 is a plan view, illustrating a configuration of a unit cell of a SRAM of a semiconductor device in an embodiment.

FIG. 8 is a plan view, illustrating a configuration of an unit cell of such SRAM. The fundamental configuration of the unit cell shown in FIG. 8 is similar to that shown in FIG. 5A, except that the gate electrode 161 and the gate electrode 163 have L-shaped two-dimensional geometries. Further, the gate electrode 161 is not overlapped with the semiconductor region 153, and a portion of gate electrode 161 is adjacent to the semiconductor region 153. Such adjacent portion is provided with a contact 195, which is coupled to the semiconductor region 153 and a contact 193, which is coupled to the gate electrode 161. The contact 193 and the contact 195 are electrically coupled in the upper layer, and similar electrical connecting as in the case of forming the shared contact can be obtained.

Similarly, the gate electrode 163 is not overlapped with the semiconductor region 155, and a portion of the gate electrode 163 is adjacent to the semiconductor region 155. Such adjacent portion is provided with a contact 197, which is coupled to the semiconductor region 155 and a contact 199, which is coupled to the gate electrode 163. The contact 197 and the contact 199 are electrically coupled in the upper layer, and similar electrical connecting as in the case of forming the shared contact can be obtained.

Here, in FIG. 8, similarly as in FIG. 4, the locations of the contacts represent the locations of the upper plugs constituting the stack contacts (correspond to plug 139 of FIG. 1).

In the present embodiment, the configuration of the stack contact 141 and the stack contact 143 of FIG. 1 described above is applied to, for example, a pair of adjacent contact 193 and contact 195. In such configuration, the advantageous effects same as obtained by the above-mentioned embodiment can be also obtained.

While embodiments of the present invention has been fully described in reference to the annexed figures, it is intended to present these embodiments for the purpose of illustrations of the present invention only, and various modifications thereof are available.

For example, while the above embodiments illustrate the exemplary implementations of the third interlayer insulating film 113 serving as the layer for forming the DRAM capacitor 127, the element formed in the third interlayer insulating film 113 is not limited to the DRAM capacitor 127, and other type of relatively dense element such as a decoupling capacitor, for example, may alternatively be employed.

Further, while the above embodiment illustrates that the third interlayer insulating film 113 is thicker than the first interlayer insulating film 109, it is sufficient that at least the second interlayer insulating film 114 is thicker than the first interlayer insulating film 109 or than the interlayer insulating film 111.

Further, while the configuration of the bit line 123 provided in the lower layer of the DRAM capacitor 127 is illustrated in FIG. 1 and FIG. 2, the bit line 123 may be alternatively formed in the upper layer of the DRAM capacitor 127. In this case, a stack contact for connecting the bit line 123 with the diffusion layer 131 may be constituted, and a plug extending through the third interlayer insulating film 113 and the fourth interlayer insulating film 115 in the stack contact may have substantially the identical geometry to the plug 139.

It is apparent that the present invention is not limited to the above embodiment, and may be modified and changed without departing from the scope and spirit of the invention.

What is claimed is:

1. A semiconductor device, comprising:
a first interlayer insulating film provided above a semiconductor substrate;
a second interlayer insulating film, provided above said first interlayer insulating film, and having a larger thickness than the thickness of said first interlayer insulating film; and
a pair of adjacent electroconductive connecting plugs, provided to cover from said first interlayer insulating film to said second interlayer insulating film, and extending through said first interlayer insulating film and said second interlayer insulating film,
wherein each of said pair of adjacent electroconductive connecting plugs includes an electroconductive first plug extending through said first interlayer insulating film and an electroconductive second plug extending through said second interlayer insulating film and being coupled to said electroconductive first plug,
wherein said electroconductive first plugs and said electroconductive second plugs are arranged in said pair of adjacent electroconductive connecting plugs so that a center-to-center distance of said electroconductive second plugs is larger than a center-to-center distance of said electroconductive first plugs along both a first direction and a second direction perpendicular to the first direction, and
wherein the electroconductive first and second plugs have tapered geometries, said electroconductive first plugs connected to a gate electrode are parallel to each other, and said first direction is parallel to said gate electrode.

2. The semiconductor device as set forth in claim 1, wherein said second interlayer insulating film is composed of a third interlayer insulating film provided above said first interlayer insulating film, and a fourth interlayer insulating film provided so as to be in contact with an upper portion of said third interlayer insulating film.

3. The semiconductor device as set forth in claim 2, wherein said third interlayer insulating film is thicker than said first interlayer insulating film.

4. A semiconductor device, comprising:
a first element region provided in a semiconductor substrate, said first element region containing a capacitor;
a second element region provided in said semiconductor substrate;
a first interlayer insulating film provided above said semiconductor substrate covering from said second element region to said first element region;
a third interlayer insulating film, provided above said first interlayer insulating film covering from said second element region to said first element region and having said capacitor embedded in said first element region; and
a fourth interlayer insulating film, provided so as to be in contact with an upper portion of said third interlayer insulating film and to cover from said first element region to said second element region, and provided above said capacitor, wherein said first element region is provided with a first diffusion layer provided in said semiconductor substrate and a first connecting plug extending through said third interlayer insulating film and said fourth interlayer insulating film and coupled to said first diffusion layer, wherein said second element region is provided with a pair of adjacent second connecting plugs provided to cover from said first interlayer insulating film to said fourth interlayer insulating film and extending through said first interlayer insulating film, said third interlayer insulating film and said fourth interlayer insulating film, wherein each of said pair of adjacent second connecting plugs includes an electroconductive first plug extending through said first interlayer insulating film and an electroconductive second plug extending through said third interlayer insulating film and said fourth interlayer insulating film and providing an electrical connection to said electroconductive first plug, wherein said pair of adjacent second connecting plugs have a geometry that is substantially same as a geometry of said first connecting plug, the first and second connecting plugs having tapered geometries, and wherein said pair of adjacent second connecting plugs are arranged so that a center-to-center distance of said electroconductive second plugs is larger than a center-to-center distance of said electroconductive first plugs along both a first direction and a second direction perpendicular to the first direction.

5. The semiconductor device as set forth in claim 4, wherein said capacitor is a dynamic random access memory (DRAM) capacitor.

6. The semiconductor device as set forth in claim 4, wherein said second element region is a region including a static random access memory (SRAM) cell, and each of said pair of adjacent second connecting plugs constitutes said common SRAM cell.

7. The semiconductor device as set forth in claim 6, wherein said SRAM cell includes a gate electrode provided above said semiconductor substrate and a second diffusion layer provided in a lateral side of said gate electrode of said semiconductor substrate, and wherein each of said pair of adjacent second connecting plugs are provided so as to be in contact with either said gate electrode or with said second diffusion layer in a bottom surface.

8. The semiconductor device as set forth in claim 7, wherein three or more of said second connecting plugs are provided in said second element region, and wherein, in said pair of adjacent second connecting plugs among said three or more second connecting plugs, the shortest center-to-center distance of the plugs is provided in the lowermost layer constituting said second connecting plug.

9. The semiconductor device as set forth in claim 6, wherein said SRAM cell includes a gate electrode provided above said semiconductor substrate, a third diffusion layer provided in said semiconductor substrate arranged in a side of said gate electrode and a shared contact plug that provides an electrical connecting between said gate electrode and said third diffusion layer, and wherein both of said pair of adjacent second connecting plugs are said shared contact plugs that constitute said common SRAM cell.

10. The semiconductor device as set forth in claim 4, further comprising a third element region provided in said semiconductor substrate, wherein said third element region is a logic region.

11. The semiconductor device as set forth in claim 10, wherein said logic region includes a central processing unit (CPU) and a logic circuit.

* * * * *